United States Patent
Aoyama et al.

(10) Patent No.: US 8,253,503 B2
(45) Date of Patent: Aug. 28, 2012

(54) ATOMIC OSCILLATOR AND CONTROL METHOD OF ATOMIC OSCILLATOR

(75) Inventors: Taku Aoyama, Setagaya (JP); Koji Chindo, Kawasaki (JP)

(73) Assignee: Seiko Epson Corporation (JP)

( * ) Notice: Subject to any disclaimer, the term of this patent is extended or adjusted under 35 U.S.C. 154(b) by 58 days.

(21) Appl. No.: 12/876,485

(22) Filed: Sep. 7, 2010

(65) Prior Publication Data

US 2011/0063037 A1    Mar. 17, 2011

(30) Foreign Application Priority Data

Sep. 16, 2009 (JP) .................................. 2009-214134

(51) Int. Cl.
*H03L 7/26* (2006.01)
*H01S 1/06* (2006.01)
(52) U.S. Cl. .......................................... 331/94.1; 331/3
(58) Field of Classification Search ............... 331/3, 94.1
See application file for complete search history.

(56) References Cited

U.S. PATENT DOCUMENTS

| 6,222,424 B1 * | 4/2001 | Janssen et al. ............... 331/94.1 |
| 6,265,945 B1 | 7/2001 | Delaney et al. ................... 331/3 |
| 7,345,553 B2 * | 3/2008 | Berberian et al. ........... 331/94.1 |

* cited by examiner

*Primary Examiner* — Arnold Kinkead
(74) *Attorney, Agent, or Firm* — Harness, Dickey & Pierce, P.L.C.

(57) ABSTRACT

A method of controlling an atomic oscillator includes generating a resonant light pair in response to a center frequency signal and a sideband signal, and setting the sideband signal so that an electromagnetically induced transparency (EIT) phenomenon does not occur in a gas cell of the atomic oscillator. The method includes applying the resonant light pair to the gas cell and detecting an intensity level of light transmitted through the gas cell. While the sideband signal is set so that the EIT phenomenon is not occurring, the center frequency signal is varied until a minimum value of the intensity level is identified. A first frequency is calculated by subtracting a predetermined frequency offset from the center frequency at which the intensity level was equal to the minimum value. A center frequency of the resonant light pair is set to the first frequency for operation of the atomic oscillator.

8 Claims, 4 Drawing Sheets

ATOMIC OSCILLATOR AND CONTROL METHOD OF ATOMIC OSCILLATOR

BACKGROUND

1. Technical Field

The present invention relates to an atomic oscillator, and particularly to a technique to generate an optimum frequency of EIT to maximize EIT intensity in an atomic oscillator of an EIT system.

2. Related Art

An atomic oscillator based on an electromagnetically induced transparency system (EIT system, also called a CPT system) is an oscillator using a phenomenon (EIT phenomenon) in which when two resonant lights different from each other in wavelength are simultaneously irradiated to an alkali metal atom, the absorption of the two resonant lights is stopped. Only one pair of two resonant lights different in wavelength is prepared, and the frequency is controlled so that the frequency difference (wavelength difference) between the two simultaneously irradiated resonant lights accurately coincides with an energy difference ΔE12 between the respective ground levels. An initial operation at the time when the atomic oscillator in a stop state is started will be described. When the power source of the atomic oscillator is turned on, first, a wavelength of a light source is swept to find the bottom of an absorption band of an objective alkali metal atom. That is, the minimum value of a detection signal is detected when the center frequency of a resonant light pair is swept, that point is determined to be an excitation frequency (excitation wavelength), and an EIT signal is obtained.

U.S. Pat. No. 6,265,945 (patent document 1) discloses a structure and an operation method of a CPT system small atomic oscillator of a sideband system in which a surface emitting laser (VCSEL) is used as a light source.

However, it is experimentally confirmed that the excitation frequency (excitation wavelength) at which the maximum EIT signal intensity is obtained is not the bottom of the absorption band and is shifted to a low frequency side from the bottom of the absorption band (FIG. 4 shows a case where the alkali metal atom is a cesium (Cs) atom, and the EIT signal intensity is maximum at the frequency of point P. The bottom of the absorption band is near 500 (MHz) in the value of the horizontal axis of the drawing. Incidentally, the reference (zero point) of the absolute value of the horizontal axis is arbitrary.). Thus, in the related art atomic oscillator, it can not be necessarily said that the maximum EIT signal is detected, and the degradation of S/N is caused.

Besides, in the related art disclosed in the patent document 1, the frequency condition of two light waves to maximize the CPT (EIT) signal intensity is not prescribed.

SUMMARY

An advantage of some aspects of the invention is to provide an atomic oscillator in which a resonant light pair is generated by supplying a sideband component of a frequency slightly shifted so as not to generate EIT, the center frequency is swept in this state to detect the bottom of a detection signal, and when the bottom is detected, the center frequency of the resonant light pair is shifted to a low frequency (long wavelength) side, and the sideband modulation wave is swept, so that the maximum EIT signal is detected, the S/N is improved and the frequency can be stabilized.

Another advantage of some aspects of the invention is to solve at least a part of the problems mentioned above and the invention can be implemented as the following embodiments or application examples.

APPLICATION EXAMPLE 1

According to this application example of the invention, an atomic oscillator includes a gaseous alkali metal atom, a light source to generate a resonant light for generating an electromagnetically induced transparency phenomenon (EIT phenomenon) in the gaseous alkali metal atom, a high frequency generation unit that supplies a high frequency signal to the light source and generates the resonant light pair, a center frequency variable unit that supplies a direct current signal to the light source and varies a center frequency of the resonant light pair, a light detection unit that detects the resonant light transmitted through the gaseous alkali metal atom and outputs a detection signal corresponding to intensity of the transmitted resonant light, an absorption detection unit that detects a minimum value of the detection signal when the frequency of the resonant light is varied, and a signal processing unit that controls supply or stop of the high frequency signal outputted from the high frequency generation unit. The signal processing unit compares the minimum value detected by the absorption detection unit with the detection signal in a state where output of the high frequency signal is stopped, controls the center frequency variable unit so that the detection signal becomes larger than the minimum value by a specified value, and sets the center frequency of the resonant light pair. The set center frequency is set to be lower than the frequency of the resonant light corresponding to the minimum value.

In the application example of the invention, the signal processing unit outputs an output control signal to control the supply and stop of the high frequency signal from the high frequency generation unit, and a frequency control signal to sweep the frequency of the high frequency generation unit. When the minimum value (bottom) of the signal generated when the center frequency is swept by the center frequency variable unit is detected, the center frequency (wavelength) is shifted to the low frequency (long wavelength) side, the high frequency generation unit modulates the light source by the high frequency, and an EIT signal is detected by sweeping the high frequency by the signal processing unit. By this, the maximum EIT signal can be detected, S/N is improved, and the frequency of the atomic oscillator can be stabilized.

APPLICATION EXAMPLE 2

According to this application example of the invention, an atomic oscillator includes a gaseous alkali metal atom, a light source to generate a resonant light for generating an electromagnetically induced transparency phenomenon (EIT phenomenon) in the gaseous alkali metal atom, a high frequency generation unit that supplies a high frequency signal to the light source and generates a resonant light pair, a center frequency variable unit that supplies a direct current signal to the light source and varies a center frequency of the resonant light pair, a light detection unit that detects the resonant light pair transmitted through the gaseous alkali metal atom and outputs a detection signal corresponding to intensity of the transmitted resonant light pair, an absorption detection unit that detects a minimum value of the detection signal when the center frequency of the resonant light pair is varied, and a signal processing unit that sets a frequency of the high frequency signal to a specified frequency at which the electromagnetically induced transparency phenomenon (EIT phenomenon) does not occur. The signal processing unit compares the minimum value stored by the absorption detection unit with the detection signal in a state where the electromagnetically induced transparency phenomenon (EIT phenomenon) is stopped, controls the center frequency variable unit so that the detection signal becomes larger than the minimum value by a specified value, and sets the center frequency of the resonant light pair. The set center frequency is set to be lower than the center frequency of the resonant light pair corresponding to the minimum value.

In the application example of the invention, the high frequency signal is supplied to the light source from the beginning. However, the frequency of the high frequency signal is slightly shifted from the frequency at which the EIT occurs. By this, when the minimum value of the detection signal is detected by sweeping the center frequency, the EIT phenomenon does not occur. When the bottom of the detection signal is detected, the center frequency is shifted to the low frequency (long wavelength) side, and the high frequency is swept by the signal processing unit, so that the EIT signal is detected. By this, the maximum EIT signal can be detected, S/N is improved and the frequency can be stabilized.

APPLICATION EXAMPLE 3

The gaseous alkali metal atom may be cesium (Cs), and the set center frequency of the resonant light pair may be set to be lower than the frequency of the resonant light corresponding to the minimum value by 100 to 300 MHz.

It is experimentally confirmed that the frequency at which the EIT signal becomes highest is shifted to the lower frequency side from the bottom of the detection signal. Thus, in the application example of the invention, the range may be set to 100 to 300 MHz. By this, since the relation between the drive current (direct current signal) of the light source and the frequency (wavelength) is well known, the frequency can be easily set by setting the drive current.

APPLICATION EXAMPLE 4

According to this application example of the invention, a control method of an atomic oscillator uses alight source to generate a resonant light for generating an electromagnetically induced transparency phenomenon (EIT phenomenon) in an gaseous alkali metal atom. The control method includes supplying a high frequency signal to the light source to generate a resonant light pair, supplying a specified direct current signal to the light source to set a center frequency of the resonant light pair, controlling supply or stop of the high frequency signal, varying intensity of the direct current signal in a state where the supply of the high frequency signal is stopped and detecting intensity of the resonant light transmitted through the gaseous alkali metal atom, detecting a minimum value of the detected intensity of the resonant light, varying, based on the detected minimum value, the intensity of the direct current signal in a state where the supply of the high frequency signal is stopped, detecting the intensity of the resonant light transmitted through the alkali metal atom, and setting the intensity of the direct current signal to cause the intensity of the resonant light to become larger than the minimum value by a specified value.

In this application example of the invention, the same operation and advantage as those of the application example 1 of the invention are obtained.

APPLICATION EXAMPLE 5

According to this application example of the invention, a control method of an atomic oscillator uses alight source to generate a resonant light for generating an electromagnetically induced transparency phenomenon (EIT phenomenon) in an gaseous alkali metal atom. The control method includes supplying a high frequency signal to the light source to generate a resonant light pair, supplying a specified direct current signal to the light source to set a center frequency of the resonant light pair, setting a frequency of the high frequency signal to a specified frequency at which the electromagnetically induced transparency phenomenon (EIT phenomenon) does not occur, varying intensity of the direct current signal to store a minimum value of the intensity of the resonant light pair transmitted through the gaseous alkali metal atom, varying, based on the stored minimum value, the intensity of the direct current signal, detecting the intensity of the resonant light pair transmitted through the gaseous alkali metal atom, and setting the intensity of the direct current signal to cause a detection value of the intensity of the resonant light pair to become larger than the minimum value by a specified value.

In this application example of the invention, the same operation and advantage as those of the application example 2 of the invention are obtained.

APPLICATION EXAMPLE 6

The gaseous alkali metal atom may be cesium (Cs), and the specified value may be set so that the center frequency of the resonant light pair corresponding to the set intensity of the direct current signal is lower than the frequency of the resonant light corresponding to the minimum value by 100 to 300 MHz.

In this application example, the same operation and advantage as those of the application example 3 are obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. However, components, kinds, combinations, shapes, relative arrangements thereof and the like do not limit the scope of the invention but are merely explanatory examples unless there is specific description.

Figure 1:
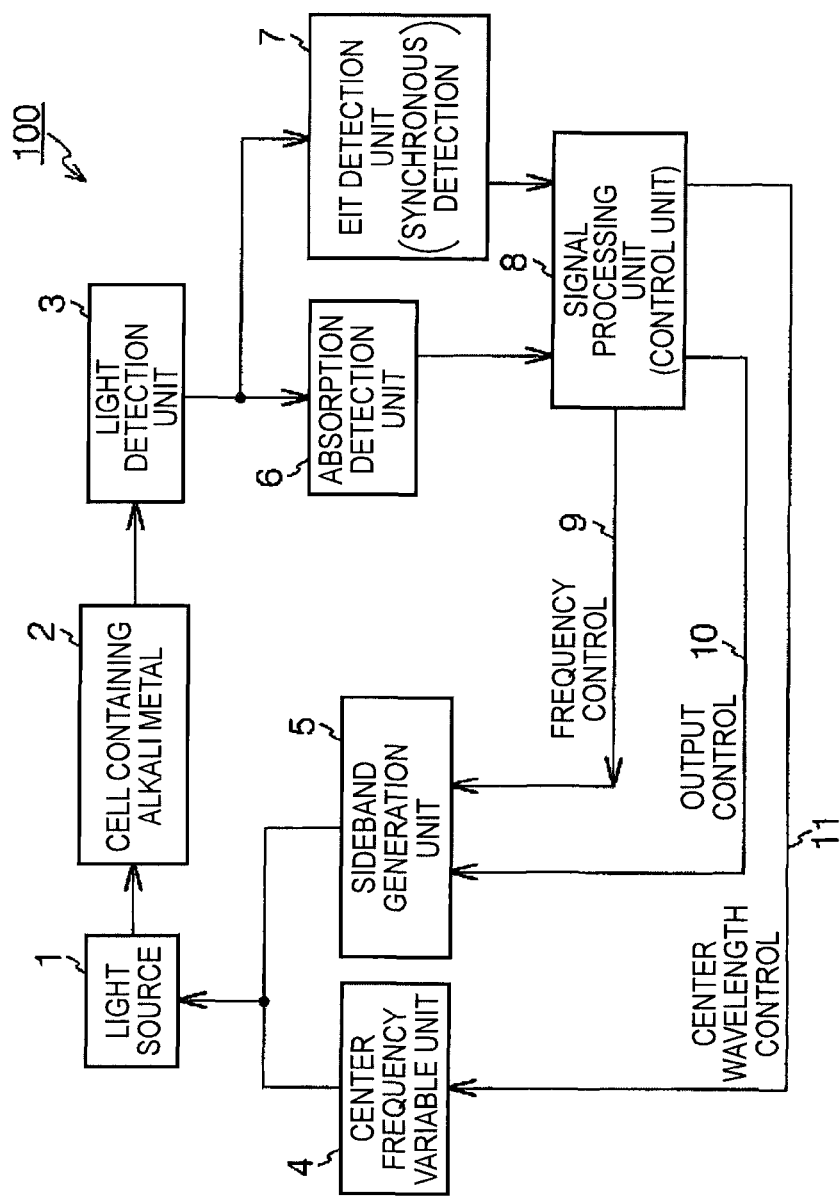
FIG. 1 is a block diagram showing a functional structure of an atomic oscillator of a first embodiment of the invention.

FIG. 1 is a block diagram showing a functional structure of an atomic oscillator of a first or a second embodiment of the invention. The atomic oscillator 100 includes a light source 1 to generate a resonant light for generating an electromagnetically induced transparency phenomenon (EIT phenomenon) in an alkali metal atom, a cell 2 containing alkali metal (hereinafter referred to as a gas cell) in which the amount of light absorption is changed by the wavelength of light from the light source 1, a sideband generation unit (high frequency generation unit) 5 that generates the resonant light pair by supplying a high frequency signal to the light source 1, a center wavelength variable unit (center frequency variable unit) 4 that varies a center frequency of the resonant light pair by supplying a direct current signal to the light source 1, a light detection unit 3 that detect the resonant light pair transmitted through the alkali metal atom and outputs a detection signal corresponding to the intensity of the transmitted resonant light pair, an absorption detection unit 6 that detects the minimum value (bottom) of the detection signal when the center frequency of the resonant light pair is varied, a signal processing unit 8 that controls supply or stop of the high frequency signal outputted from the sideband generation unit 5, and an EIT detection unit 7 that synchronously detects the output of the light detection unit 3 and detects an EIT state. Incidentally, the signal processing unit 8 outputs a frequency control signal 9 to sweep the sideband frequency of the sideband generation unit 5 and an output control signal 10 to supply or stop the sideband generated from the sideband generation unit 5.

In the state where the output of the sideband signal is stopped, the signal processing unit 8 compares the minimum value of the detection signal detected by the absorption detection unit 6 with the detection signal, and controls the center frequency variable unit 4 so that the detection signal becomes larger than the minimum value by a specified value, and sets the center frequency of the resonant light pair. The set center frequency is set to be lower than the center frequency of the resonant light pair corresponding to the minimum value.

Besides, in the state where the electromagnetically induced transparency phenomenon (EIT phenomenon) is stopped, the signal processing unit 8 compares the minimum value detected by the absorption detection unit 6 with the detection signal, and controls the center frequency variable unit 4 so that the detection signal becomes larger than the minimum value by a specified value, and sets the center frequency of the resonant light pair. The set center frequency is set to be lower than the center frequency of the resonant light pair corresponding to the minimum value.

That is, in this embodiment, the signal processing unit 8 outputs the output control signal 10 to control the supply and stop of the sideband from the sideband generation unit 5 and the frequency control signal 9 to sweep the frequency of the sideband generation unit 5. When the absorption detection unit 6 detects the minimum value (bottom) of the signal generated when the center frequency variable unit 4 sweeps the center frequency, the center frequency is shifted to the long wavelength side, and the sideband generation unit 5 modulates the light source 1 by the high frequency signal. The high frequency is swept by the frequency control signal 9 outputted from the signal processing unit 8, so that the EIT signal is detected. By this, the EIT signal of the maximum intensity can be detected, S/N is improved, and the frequency of the atomic oscillator can be stabilized.

Figure 2B:
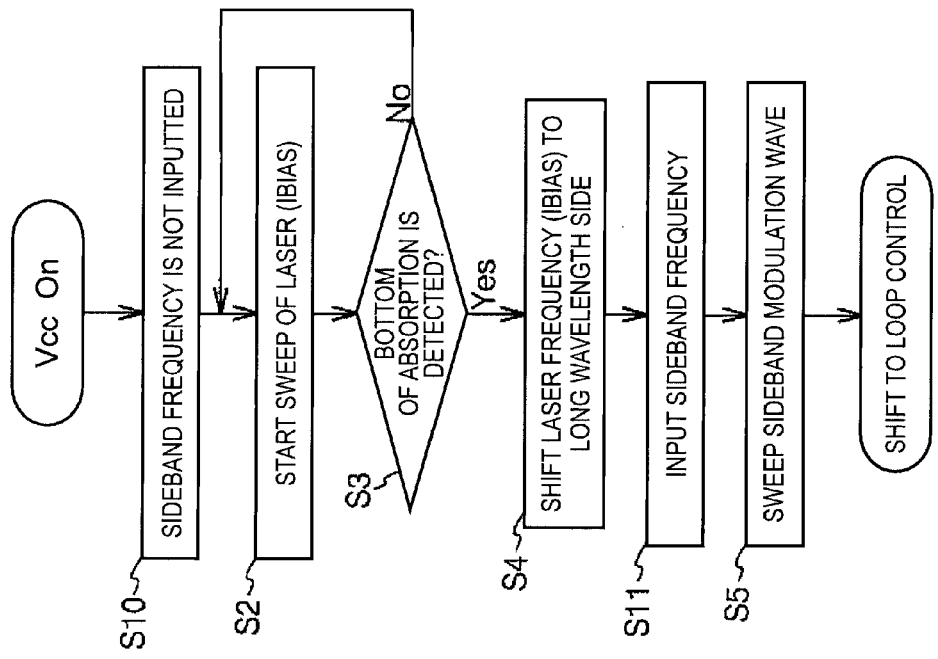
FIG. 2B is a flowchart for explaining an operation of an atomic oscillator of a second embodiment of the invention.
Figure 2A:
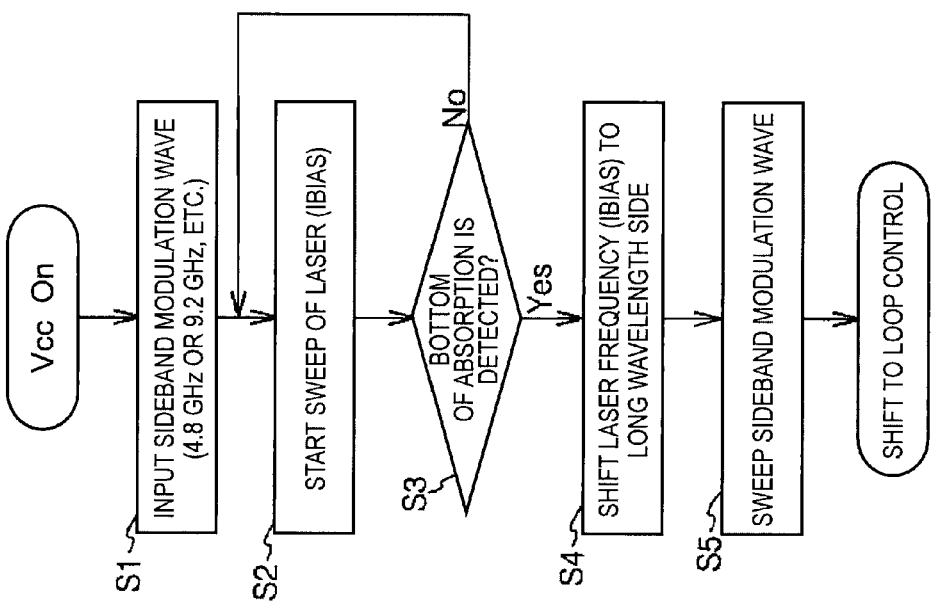
FIG. 2A is a flowchart for explaining an operation of the atomic oscillator of the first embodiment of the invention.
Figure 3A:
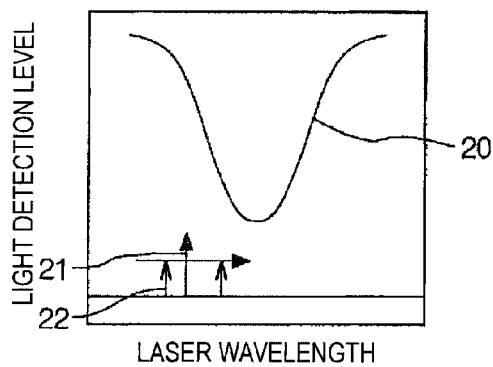
FIG. 3A is a view showing an output signal from a light detection unit when the center frequency of a light source is swept.
Figure 3B:
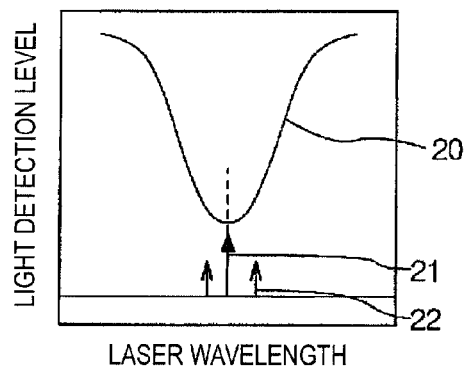
FIG. 3B is a view when the bottom of the output signal is detected.
Figure 3C:
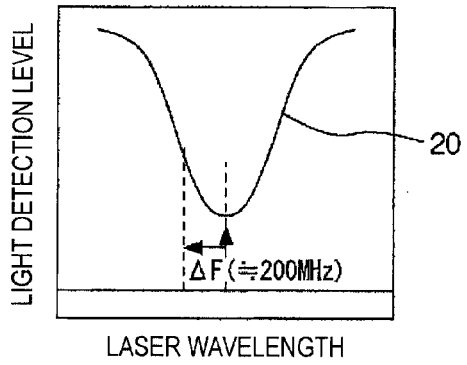
FIG. 3C is a view when the center frequency is shifted to a long wavelength side.
Figure 3D:
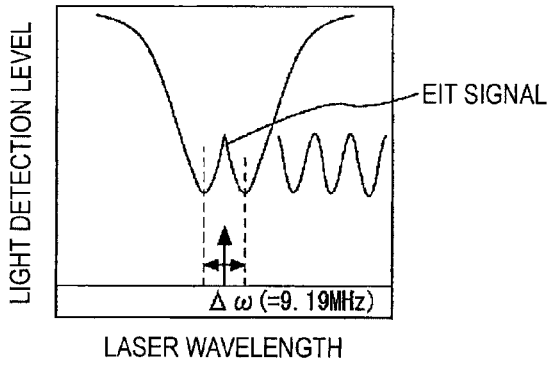
FIG. 3D is a view when a high frequency signal (sideband) is swept for Cs and an EIT signal is detected.
Figure 4:
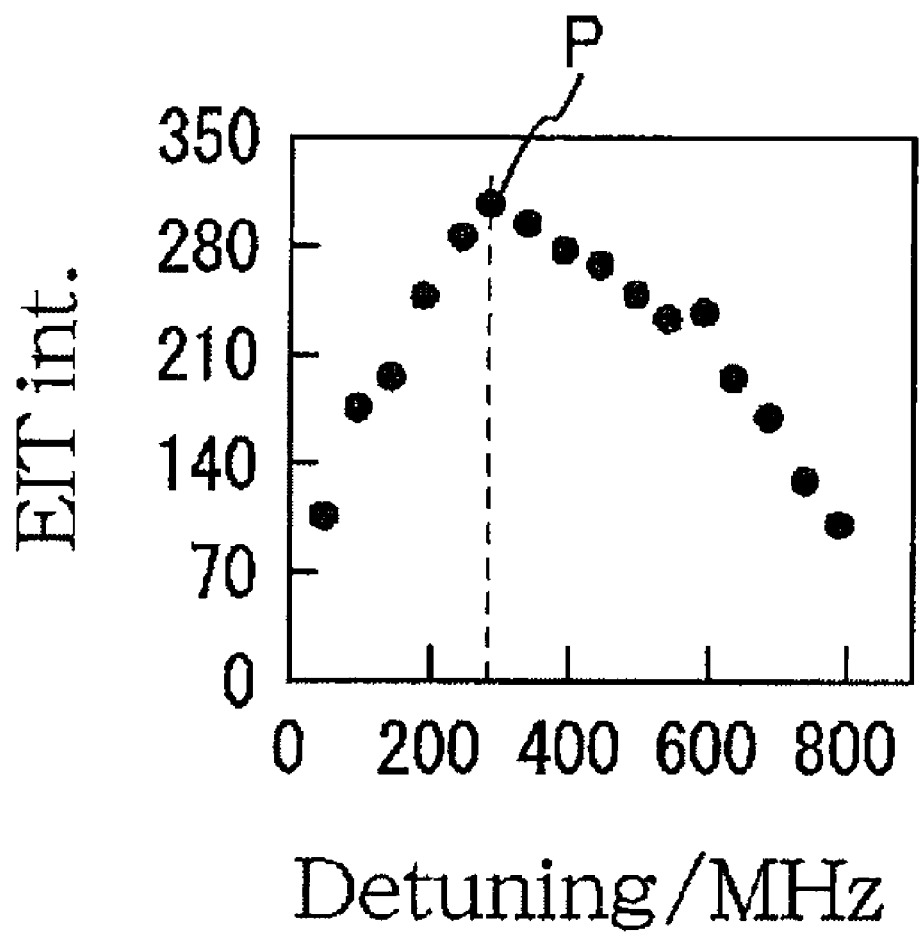
FIG. 4 is a view showing a relation between the EIT signal intensity and the center frequency for Cs.

FIG. 2A is a flowchart for explaining the operation of the atomic oscillator of the first embodiment. First, the signal processing unit 8 brings the output control signal 10 into an ON state, and the sideband (high frequency signal) is inputted to the light source 1. However, the frequency of the sideband (high frequency signal) at this time is slightly shifted so that the EIT phenomenon does not occur (S1). For example, when the alkali metal atom is Cs, since $\Delta E_{12}$ is 9.192 GHz (or 4.596 GHz of the half value thereof) in terms of frequency, the frequency is shifted from these values. Next, the center frequency variable unit 4 sweeps the center frequency (S2). At this time, as shown in FIG. 3A, the light detection unit 3 outputs the detection signal like a waveform 20. Besides, as spectra, a spectrum 21 of the light source 1 and a spectrum 22 of the sideband appear. At this time, since the frequency of the sideband is slightly shifted so that the EIT phenomenon does not occur, the EIT phenomenon does not occur, and the bottom (minimum value) of the detection signal is detected (Y at S3) (see FIG. 3B). Incidentally, it is determined that the bottom of absorption occurs when such a condition is satisfied that the bottom of absorption continues for a certain time or the change becomes a certain level or less. Next, when the bottom of absorption is detected, the center frequency is shifted to a long wavelength side (S4) (see FIG. 3C). The amount of shift is about 200 MHz. The signal processing unit 8 sweeps the sideband by the frequency control signal 9 while the sideband is added (S5). Thereafter, shift is made to sweep control, and the EIT detection unit 7 detects the EIT signal (see FIG. 3D).

That is, in this embodiment, the sideband (high frequency signal) is supplied to the resonant light pair from the beginning. However, the frequency of the sideband is slightly shifted from the frequency at which the EIT occurs. By this, when the minimum value of the detection signal is detected by sweeping the center frequency, the EIT phenomenon does not occur. When the bottom (minimum value) of the detection signal is detected, the center frequency is shifted to the long wavelength side, the sideband generation unit 5 modulates the light source 1 by the sideband, and the sideband is swept by the signal processing unit 8 to detect the EFI signal. By this, the EIT signal having the maximum intensity can be detected, S/N is improved, and the frequency of the atomic oscillator can be stabilized.

Besides, it is experimentally confirmed that the frequency at which the EIT signal becomes highest is shifted to the low frequency side from the bottom (minimum value) of the detection signal. In this embodiment, the range is set to 100 to 300 MHz. By this, since the relation between the drive current of the light source 1 and the frequency (wavelength) is well known, the frequency can be easily set by setting the drive current.

FIG. 2B is a flowchart for explaining the operation of the atomic oscillator of the second embodiment. The same step is denoted by the same reference number and is described. First, the signal processing unit 8 brings the output control signal 10 into an OFF state and prohibits the sideband (high frequency signal) from entering the light source 1 (S10). Next, the center frequency variable unit 4 sweeps the center frequency (S2). At this time, as shown in FIG. 3A, the light detection unit 3 outputs the detection signal like the waveform 20. Besides, as a spectrum, only the spectrum 21 of the light source 1 appears. At this time, since the sideband is not inputted, the EIT phenomenon does not occur, and the bottom (minimum value) of the detection signal is detected (Y at S3) (see FIG. 3B). Incidentally, it is determined that the bottom of absorption occurs when such a condition is satisfied that the bottom of absorption continues for a certain time or the change becomes a certain level or less. Next, when the bottom of absorption is detected, the center wavelength is shifted to the long wavelength side (S4) (see FIG. 3C). The amount of shift is about 200 MHz. Next, the signal processing unit 8 brings the output control signal 10 into an ON state and inputs the sideband to the light source 1 (S11). The signal processing unit 8 sweeps the sideband by the frequency control signal 9 while the sideband is added (S5). Thereafter, shift is made to sweep control, and the EIT detection unit 7 detects the EIT signal (see FIG. 3D).

That is, in this embodiment, the sideband (high frequency signal) is not supplied at first. By this, when the center frequency (the frequency of a resonant light) is swept and the minimum value of the detection signal is detected, the EIT phenomenon does not occur. When the bottom of the detection signal is detected, the center frequency is shifted to the long wavelength side, and the sideband generation unit 5 supplies the sideband to the light source 1. Next, the modulation is performed by the sideband, and the sideband is swept by the signal processing unit 8 so that the EIT signal is detected. By this, the EIT signal having the maximum intensity can be detected, S/N is improved and the frequency of the atomic oscillator can be stabilized.

The entire disclosure of Japanese Patent Application No. 2009-214134, filed Sep. 16, 2009 is expressly incorporated by reference herein.

What is claimed is:

1. An atomic oscillator comprising:
   a gaseous alkali metal atom;
   a light source to generate a resonant light for generating an electromagnetically induced transparency phenomenon in the gaseous alkali metal atom;
   a high frequency generation unit that supplies a high frequency signal to the light source and generates a resonant light pair;
   a center frequency variable unit that supplies a direct current signal to the light source and varies a center frequency of the resonant light pair;
   a light detection unit that detects resonant light of the resonant light pair transmitted through the gaseous alkali metal atom and outputs a detection signal corresponding to intensity of the transmitted resonant light of the transmitted resonant light pair;
   an absorption detection unit that detects a minimum value of the detection signal when the frequency of the resonant light is varied; and
   a signal processing unit that controls supply or stop of the high frequency signal outputted from the high frequency generation unit, wherein
   the signal processing unit compares the minimum value detected by the absorption detection unit with the detection signal in a state where output of the high frequency signal is stopped, controls the center frequency variable unit to cause the detection signal to become larger than the minimum value by a specified value, and sets a center frequency of the resonant light pair to be lower than the frequency of the resonant light corresponding to the minimum value.

2. An atomic oscillator comprising:
   a gaseous alkali metal atom;
   a light source to generate a resonant light for generating an electromagnetically induced transparency phenomenon in the gaseous alkali metal atom;
   a high frequency generation unit that supplies a high frequency signal to the light source and generates a resonant light pair;
   a center frequency variable unit that supplies a direct current signal to the light source and varies a center frequency of the resonant light pair;
   a light detection unit that detects resonant light pair transmitted through the alkali metal atom and outputs a detection signal corresponding to intensity of the transmitted resonant light pair;
   an absorption detection unit that detects a minimum value of the detection signal when the center frequency of the resonant light pair is varied; and
   a signal processing unit that sets a frequency of the high frequency signal to a specified frequency at which the electromagnetically induced transparency phenomenon does not occur, wherein
   the signal processing unit compares the minimum value detected by the absorption detection unit with the detection signal in a state where the electromagnetically induced transparency phenomenon is stopped, controls the center frequency variable unit to cause the detection signal to become larger than the minimum value by a specified value, and sets the center frequency of the resonant light pair to be lower than the center frequency of the resonant light pair corresponding to the minimum value.

3. The atomic oscillator according to claim 1, wherein the gaseous alkali metal atom is cesium, and a center frequency of the resonant light pair is set to be lower than the frequency of the resonant light corresponding to the minimum value by 100 to 300 MHz.

4. A control method of an atomic oscillator using a light source to generate a resonant light for generating an electromagnetically induced transparency phenomenon in an gaseous alkali metal atom, the control method comprising:
   supplying a high frequency signal to the light source to generate a resonant light pair;
   supplying a specified direct current signal to the light source to set a center frequency of the resonant light pair;
   controlling supply or stop of the high frequency signal;
   varying intensity of the direct current signal in a state where the supply of the high frequency signal is stopped and detecting intensity of the resonant light transmitted through the gaseous alkali metal atom;
   detecting a minimum value of the detected intensity of the resonant light; and
   varying, based on the detected minimum value, the intensity of the direct current signal in the state where the supply of the high frequency signal is stopped, detecting the intensity of the resonant light transmitted through the gaseous alkali metal atom, and setting the intensity of the direct current signal to cause the intensity of the resonant light to become larger than the minimum value by a specified value.

5. A control method of an atomic oscillator using a light source to generate a resonant light for generating an electromagnetically induced transparency phenomenon in an gaseous alkali metal atom, the control method comprising:
   supplying a high frequency signal to the light source to generate a resonant light pair;
   supplying a direct current signal to the light source to set a center frequency of the resonant light pair;
   setting a frequency of the high frequency signal to a specified frequency at which the electromagnetically induced transparency phenomenon does not occur;
   varying intensity of the direct current signal to store a minimum value of the intensity of the resonant light pair transmitted through the gaseous alkali metal atom; and
   varying, based on the stored minimum value, intensity of the direct current signal, detecting the intensity of the resonant light pair transmitted through the gaseous alkali metal atom, and setting the intensity of the direct current signal to cause a detection value of the intensity of the resonant light pair to become larger than the minimum value by a specified value.

6. The control method according to claim 4, wherein the gaseous alkali metal atom is cesium, and the specified value is set to cause the center frequency of the resonant light pair corresponding to the set intensity of the direct current signal to become lower than the frequency of the resonant light corresponding to the minimum value by 100 MHz to 300 MHz.

7. A method of controlling an atomic oscillator including a gas cell, the method comprising:
- generating a resonant light pair in response to a center frequency signal and a sideband signal;
- setting the sideband signal so that an electromagnetically induced transparency (EIT) phenomenon does not occur in the gas cell;
- applying the resonant light pair to the gas cell;
- detecting an intensity level of light transmitted through the gas cell;
- while the sideband signal is set so that the EIT phenomenon is not occurring, varying the center frequency signal of the resonant light pair until a minimum value of the intensity level is identified;
- calculating a first frequency by subtracting a predetermined frequency offset from the center frequency of the resonant light pair at which the intensity level was equal to the minimum value; and
- setting a center frequency of the resonant light pair to the first frequency for operation of the atomic oscillator.

8. A method of controlling an atomic oscillator including a gas cell, the method comprising:
- generating a resonant light pair in response to a center frequency signal and a sideband signal;
- setting the sideband signal so that an electromagnetically induced transparency (EIT) phenomenon does not occur in the gas cell;
- applying the resonant light pair to the gas cell;
- detecting an intensity level of light transmitted through the gas cell;
- while the sideband signal is set so that the EIT phenomenon is not occurring, varying the center frequency signal until a minimum value of the intensity level is identified;
- calculating a first intensity value by adding a predetermined offset to the minimum value;
- while the sideband signal is set so that the EIT phenomenon is not occurring, decreasing a center frequency of the resonant light pair starting from a first frequency, until the intensity level is equal to the first intensity value, wherein the first frequency is the center frequency of the resonant light pair at which the intensity level was equal to the minimum value; and
- setting a center frequency of the resonant light pair to a second frequency for operation of the atomic oscillator, wherein the second frequency is the center frequency of the resonant light pair at which the intensity level was equal to the first intensity value.

* * * * *